(12) United States Patent
Esser

(10) Patent No.: US 8,944,000 B2
(45) Date of Patent: Feb. 3, 2015

(54) WORKPIECE CARRIER

(71) Applicant: Oerlikon Trading AG, Truebbach, Truebbach (CH)

(72) Inventor: Steven Esser, Aachen (DE)

(73) Assignee: Oerlikon Trading AG, Truebbach, Truebbach (CH)

( * ) Notice: Subject to any disclaimer, the term of this patent is extended or adjusted under 35 U.S.C. 154(b) by 0 days.

(21) Appl. No.: 14/142,462

(22) Filed: Dec. 27, 2013

(65) Prior Publication Data

US 2014/0109827 A1 Apr. 24, 2014

Related U.S. Application Data

(63) Continuation of application No. 12/996,928, filed as application No. PCT/EP2009/000039 on Jun. 4, 2009, now abandoned.

(30) Foreign Application Priority Data

Jun. 11, 2008 (CH) .......................................... 884/08

(51) Int. Cl.
  *B05C 13/00* (2006.01)
  *C23C 14/50* (2006.01)
  *C23C 14/56* (2006.01)
  *B05C 13/02* (2006.01)
(52) U.S. Cl.
  CPC ............... *B05C 13/00* (2013.01); *C23C 14/505* (2013.01); *C23C 14/564* (2013.01)
  USPC .......................................................... 118/500

(58) Field of Classification Search
  CPC ...... B05C 13/00; C23C 14/505; C23C 14/564
  See application file for complete search history.

(56) References Cited

U.S. PATENT DOCUMENTS 4,662,236 A * 5/1987 Kobayashi ................... 74/501.6
  2007/0004577 A1 * 1/2007 Lederer ........................... 494/20

* cited by examiner

*Primary Examiner* — Dah-Wei D Yuan
*Assistant Examiner* — Stephen Kitt
(74) *Attorney, Agent, or Firm* — Notaro, Michalos & Zaccaria P.C.

(57) ABSTRACT

Discs (7) arranged along a shaft and having holders (8) distributed over the circumference, inclined outwards and intended for workpieces are supported on a ring (5) surrounding the discs (7). Successive rings (5) form an approximately cylindrical cladding which prevents undesired coating of the discs (7). Cladding has openings for the holders (8) of a disc (7) which are uniformly distributed over the circumference at the same height, each formed by an upper recess (14) in the ring (5) carrying the disc (7) and an adjacent lower recess (15) of the following ring. Boundary lines (17) between successive rings (5) start somewhat below the narrowest points of the webs separating adjacent openings, so that the lower recesses (15) do not narrow towards the edge of the ring (5) and the upper recesses (14) narrow at most slightly so that the workpiece carrier can be assembled from bottom to top.

16 Claims, 3 Drawing Sheets

WORKPIECE CARRIER

RELATED APPLICATIONS

This is a continuation of U.S. patent application Ser. No. 12/996,928, filed on Dec. 8, 2010, now abandoned. Application Ser. No. 12/996,928 is a 35 U.S.C. 371 application based on PCT/EP2009/003998, which was filed Jun. 4, 2009. Both applications are fully incorporated by reference as if set forth in their entireties, and the benefit of those filings is claimed. The PCT application claims the priority of Swiss (CH) patent application 884/08, filed Jun. 11, 2008, which claim is also made here.

FIELD AND BACKGROUND OF THE INVENTION

The invention relates to a workpiece carrier for a coating system according to the precharacterizing clause of claim 1. A workpiece carrier of this type usually carries, in corresponding holders, a relatively large number of workpieces which are transported past coating sources several times to ensure a coating which is as uniform as possible.

Prior art DE 10 2004 027 989 A1 discloses a workpiece carrier of the generic type. In particular, it has holders inclined outwards obliquely away from the shaft, which permits a very close arrangement of the workpieces and also leads to a generally desired increase in the thickness of the coating towards the end face of the workpiece and improves the uniformity of the coating especially on end faces.

However, a disadvantage is that the discs carrying the holders, and other parts, are inevitably also coated. This requires regular cleaning, which must be effected very carefully in order to avoid damage to sensitive components, with corresponding cost, reduction of the times in use and increase of wear.

A similar workpiece carrier is disclosed in EP 1 256 637 A1. Here, the holders are aligned parallel to a rotating central shaft which drives the discs. Neither the discs nor the shaft nor further parts producing in each case rotation of the holder itself are protected from coating. Here, the holders are aligned parallel to a rotating central shaft which drives the discs. Neither the discs nor the shaft nor further parts producing in each case rotation of the holder itself are protected from coating.

SUMMARY OF THE INVENTION

It is the object of the invention to provide a workpiece carrier of the generic type, in which the discs carrying the holders are protected from undesired coating. This object is achieved by the features in the characterizing clause of claim 1.

In the workpiece carrier according to the invention, the shaft, the discs and the lower parts of the holders are covered by a cladding which has a very simple design and is easy to mount and to remove and can be cleaned easily and without danger of damage. The cladding can also serve further purposes, such as establishing the spacing of directly successive discs.

The various features of novelty which characterize the invention are pointed out with particularity in the claims annexed to and forming a part of this disclosure. For a better understanding of the invention, its operating advantages and specific objects attained by its uses, reference is made to the accompanying drawings and descriptive matter in which a preferred embodiment of the invention is illustrated.

DESCRIPTION OF THE PREFERRED EMBODIMENTS

Figure 1:
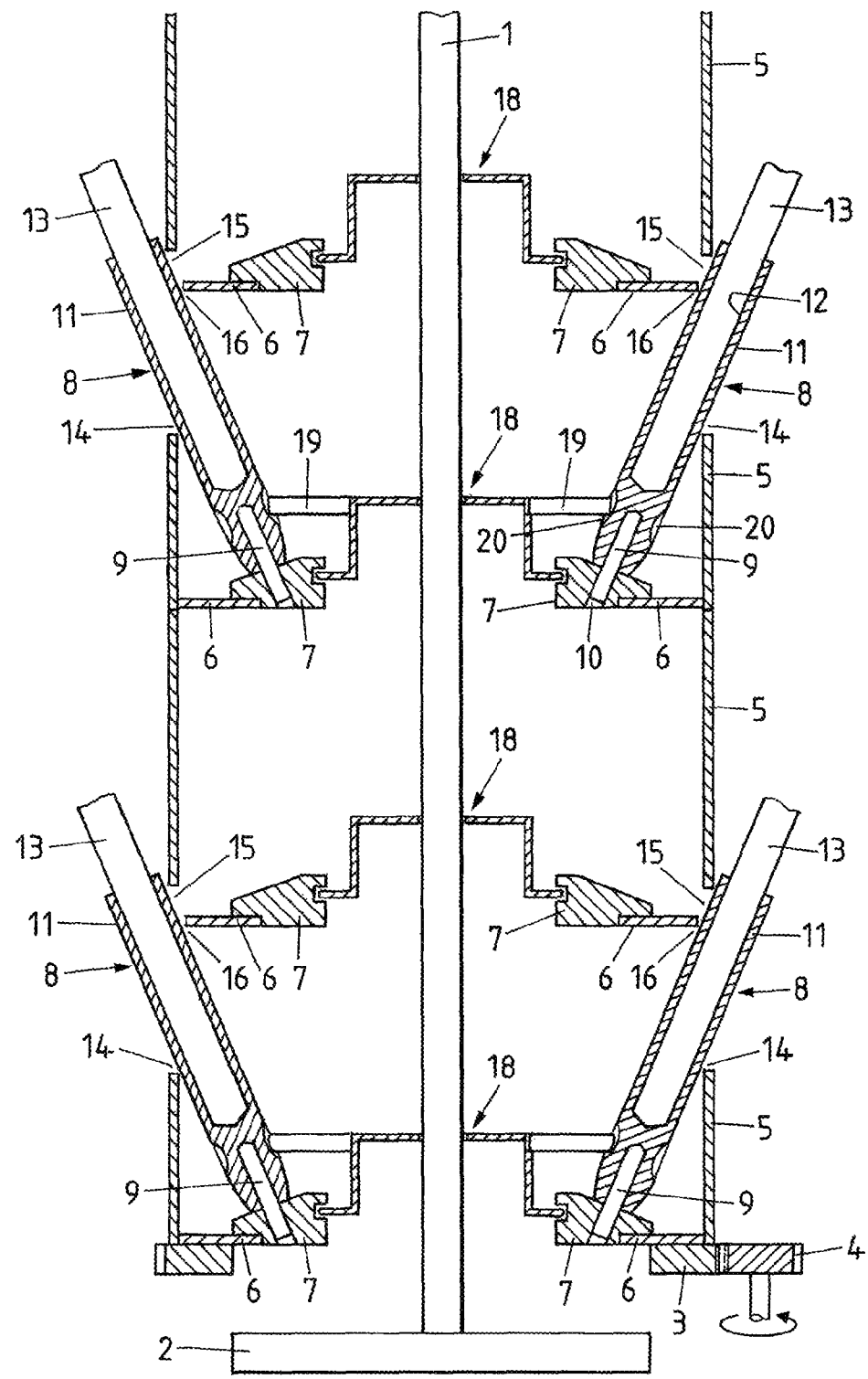
FIG. 1 schematically shows an axial longitudinal section through a workpiece carrier according to the invention, in a first embodiment.
Figure 2:
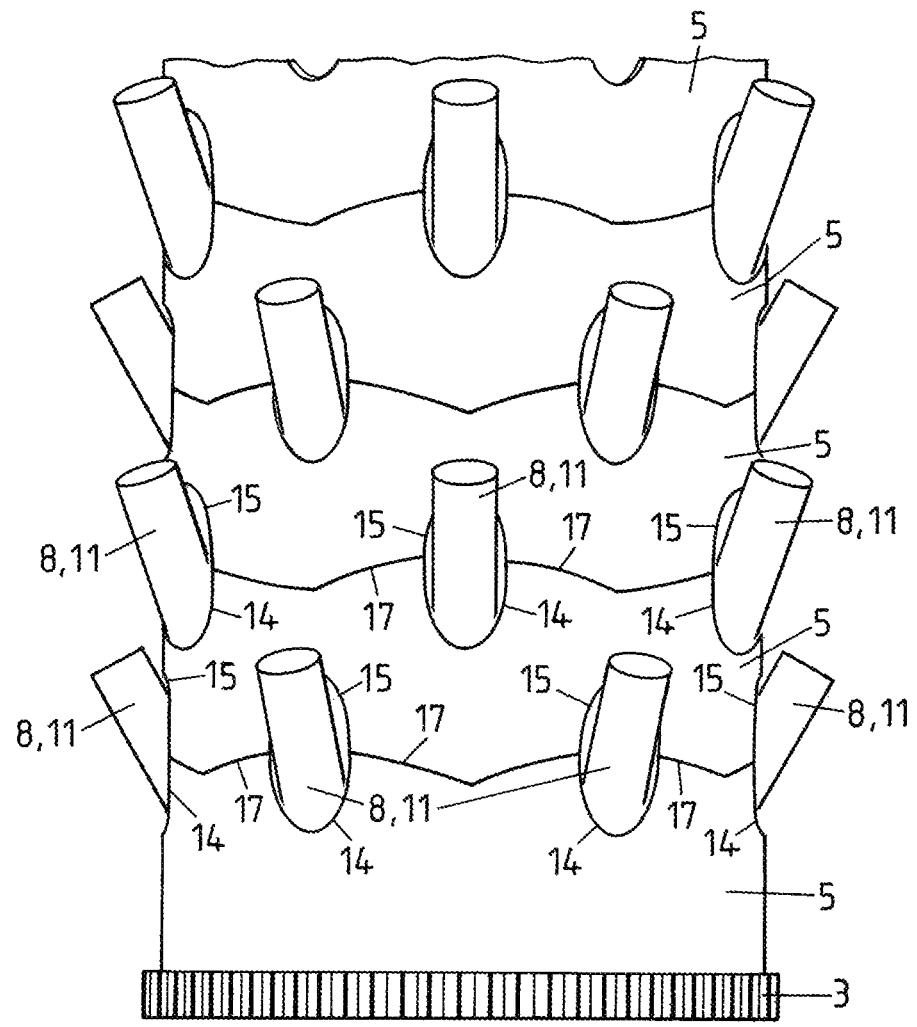
FIG. 2 shows a partial side elevational view of the workpiece carrier according to the invention, of FIG. 1.

For simplification of the presentation, the workpiece carrier according to FIGS. 1, 2 is shown somewhat schematically and is also provided with fewer holders for workpieces than will usually be provided.

It has a central perpendicular shaft 1 of non-rotationally symmetrical, preferably square, cross-section which is connected to a base 2. It can be mounted on an axis coinciding with the centre of the shaft 1 so as to be non-rotatable relative to the base 2 or rotatable about said axis and can be driveable. A gear ring 3 mounted so as to be rotatable about said axis engages a driveable pinion 4 and is driven by the latter in such a way that its rotational speed differs from that of the shaft 1 so that the gear ring 3 executes a rotational movement relative to the shaft 1.

Rings 5 of a thin rigid material, e.g. sheet metal, which in each case are of substantially cylindrical shape and together form a cylindrical cladding, are present non-rotatably in succession in the axial direction on the gear ring 3. At the lower end of a ring 5, an annular support ring 6 on which an annular disc 7 surrounding the shaft 1 is supported, likewise non-rotatably, is fastened in each case to the inside.

Each disc 7 carries an equal number—in the example six, as a rule preferably more—of identical holders inclined outwards obliquely away from the shaft 1. Each of the holders 8 comprises a bolt 9 which is anchored in an oblique bore 10 in the disc 7 and a sleeve 11 rotatably mounted on the bolt 9 and having a bore 12 for receiving a workpiece 13 (omitted in FIG. 2).

The holders 8 are distributed in each case uniformly over the circumference of the disc 7 so that adjacent holders are offset relative to one another in each case by the same angular pitch—60° in the example. The rings 5—with the exception of the uppermost ring which is not shown—each have, at the upper edge, a number of upper recesses 14 uniformly distributed over the circumference, which number corresponds to the number of holders 8, and—with the exception of the lowermost ring—likewise, at the lower edge, uniformly distributed lower recesses 15 which however are offset in each case by half the angular pitch relative to the upper recesses 14 so that one of the upper recesses 14 is in each case centred between two lower recesses 15, and vice versa.

Successive rings 5 are oriented so that the lower recesses 15 of the upper ring 5 are adjacent in each case to the upper recesses 14 of the lower ring 5, in particular so that the edges of the latter constitute a smooth continuation of those of the former. The lower recess 15 and the upper recess 14 adjacent to it together form in each case an opening in the cladding through which one of the holders 8 projects, it also being necessary for a recess 16 to be provided in each case at the outer edge of the support ring 6 of the upper ring 5. The openings which belong to a group formed in this manner between two rings are at the same height and are distributed uniformly over the circumference of the cladding. The openings which are preferably identical throughout may each have an elongated elliptical shape or a similar shape, for example may be in the form of semi-ellipses of identical or different lengths which are connected by a rectangular central piece. The rings 5 abut one another along boundary lines 17 which are led in the circumferential direction in such a way that they connect in each case adjacent openings, i.e. intersect the webs separating them, and do so in such a way that they start in the vicinity of the narrowest point between said openings, and preferably somewhat below said point, it being necessary to ensure that the upper recesses 14 narrow only to such an extent that their width is at least slightly greater even at the lower end than the diameter of the holders 8, i.e. of their sleeves 11.

The boundary line 17 is formed so that adjacent rings 5 are fixed in a required position with respect to their mutual angular position, apart from rotations through a multiple of the angular pitch. In addition, it is chosen so that said angular position automatically adopts a fixed required position if the upper ring is mounted so that it is rotated by less than half the angular pitch. This is achieved in the example by virtue of the fact that the boundary line 17 follows a preferably symmetrical V-shaped line with a lowest point in the middle between the adjacent openings which it connects. As a result, the web sections which separate adjacent lower recesses 15 slide when they rest on a sleeve 11 of a recess 8, in each case on said sleeve in such a way that the ring is automatically rotated towards the required position. Transversely thereto, the relative position of successive rings 5 can be controlled by stops which project, for example, on the inside of a ring slightly above the boundary line 17 and cooperate there with the inside of the following ring. The stops can (cf. FIG. 3) be formed, for example, by parts of the support ring 6. They can, however, also be absent since the effective formation of the boundary lines 17 over the total circumference forces the ring 5 to assume the required position in each direction.

In order to produce a rotation of each holder 8 itself, a transmission part 18 is coordinated with each of the discs 7, which transmission part 18 is preferably a part which is punched from a metal sheet and bent and which engages the shaft 1 in a displaceable but non-rotatable manner, for example by having a square recess through which said shaft projects and which is connected to the respective disc 7 in such a way that it is rotatable relative to said disc but is not displaceable or at most has limited displaceability axially, parallel to the shaft 1. It has lugs 19 which project radially outwards and engage rotary stops on the holders 8, which rotary stops are each in the form of notches 20 in the sleeve 11.

The workpiece carrier can be assembled by first mounting the lowermost ring 5 on the gear ring 3, then the lowermost disc 7, together with the corresponding transmission part 18 and the holders 8, on the support ring 6 thereof, then the next ring 5, etc. Owing to the position and properties of the boundary lines 17, this does not give rise to any difficulties since the upper recesses 14 are just wide enough even at their lower ends to be able to receive the sleeves 11 of the holders 8, and the lower recesses 15 each widen towards the edge. The position of the discs 7 in the direction of the shaft 1 is completely fixed in each case by the position of the corresponding ring 5. The position of each ring 5 in turn results from its support on the next lower ring or on the gear ring 3. The rotational position of the rings 5 need be checked in each case only approximately during assembly since their relevant orientation is effected automatically by the contact with the holders 8 of the next lower disc and finally by the V-shape of the boundary lines 17.

Figure 3:
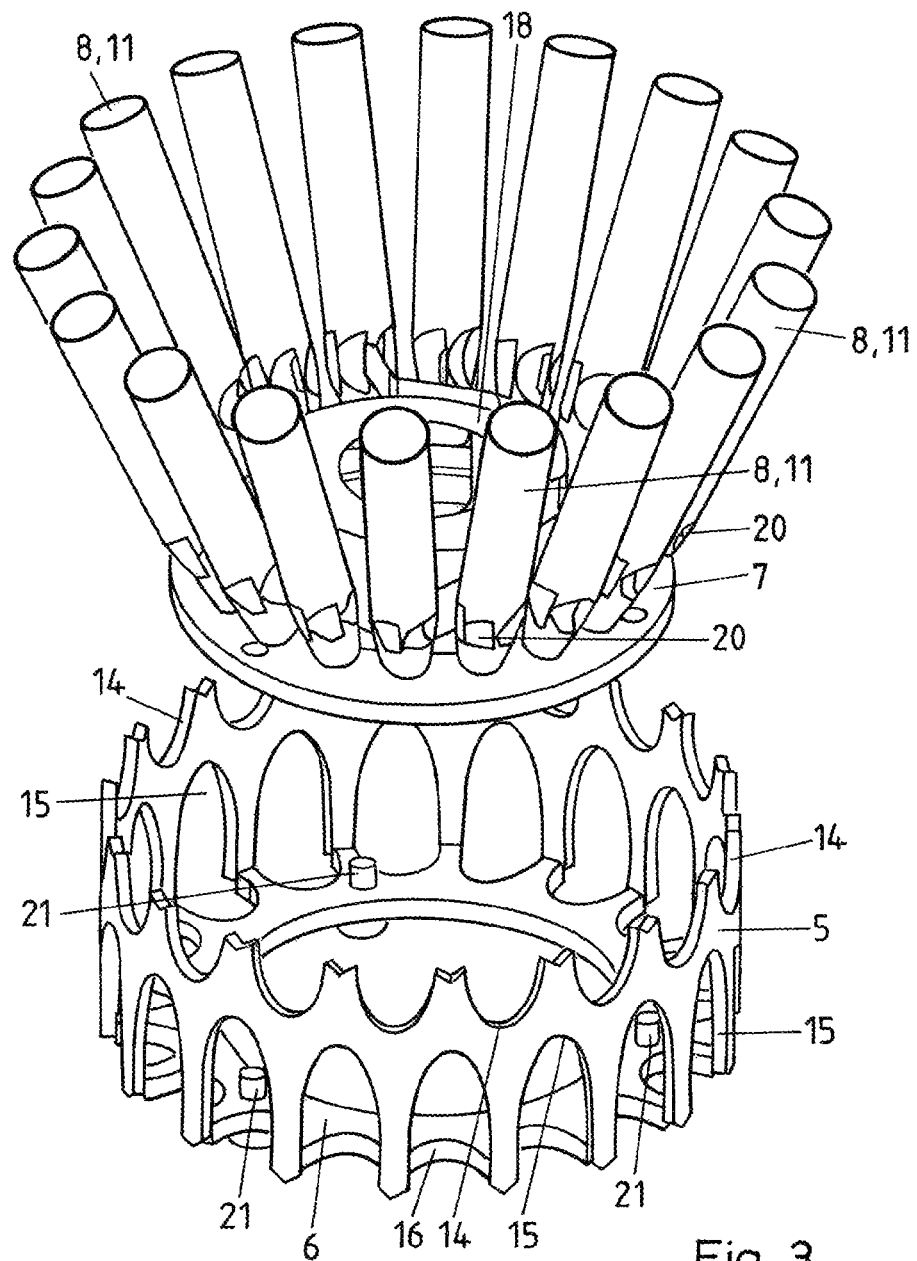
FIG. 3 shows a partial exploded perspective view of a workpiece carrier according to the invention, in a second embodiment.

FIG. 3 shows a realistic formation of a disc 7 having eighteen holders 8 and of a ring 5 coordinated with the disc 7 and having corresponding numbers of upper recesses 14, lower recesses 15 and recesses 16 on the support ring 6. Rotation-preventing devices 21 which prevent rotation of the disc 7 relative to the ring 5 when the former rests on the support ring 6 are also visible on the same. As is evident, the webs between adjacent openings are very narrow and the upper recesses 14 in turn are offset relative to the lower recesses 15 by half an angular pitch. This permits an overall very dense arrangement of the holders 8 on the workpiece carrier. The boundary lines 17 between adjacent openings are once again V-shaped with a lowest point in the middle.

Apart from the absence of lower recesses in the case of the lowermost and upper recesses in the uppermost ring and any further peculiarities of these two rings, all rings as well as all discs are identically formed in each case so that all openings are also identical. The rings are in each case invariant with rotation about a multiple of the angular pitch. Each of the rings is coordinated with one of the discs and determines the distance between said disc and the following disc.

In this respect and also otherwise, however, substantial deviations from the examples described are possible without departing from the scope of the invention. Thus, the cladding and the rings can also have a shape other than substantially cylindrical. Moreover, the number of openings of the groups—corresponding to the number of holders of the discs—can vary. The shaft may consist of a plurality of sections which are connected non-rotatably to one another and to which in each case one transmission means can then also be firmly connected. The workpiece carrier may also have a more complex design than described, for example with a plurality of units having the design described and being present on a base rotatable about an axis.

LIST OF REFERENCE SYMBOLS

1 Shaft
2 Base
3 Gear ring
4 Pinion
5 Ring
6 Support ring
7 Disc
8 Holder
9 Bolt
10 Bore
11 Sleeve
12 Bore
13 Workpiece
14 Upper recess
15 Lower recess
16 Recess
17 Boundary line
18 Transmission part
19 Lug
20 Notch
21 Rotation-preventing device While a specific embodiment of the invention has been shown and described in detail to illustrate the application of the principles of the invention, it will be understood that the invention may be embodied otherwise without departing from such principles.

What is claimed is:

1. A workpiece carrier for a coating system, comprising:
   a base;
   a shaft anchored or mounted in the base;
   a plurality of discs which follow one another along the shaft and are rotatable relative to the base and which in each case are provided with a plurality of holders distributed over a circumference of the disc, the holders being inclined obliquely outwards away from the shaft at a fixed acute angle and adapted to receive a workpiece; and
   a cladding which surrounds the shaft and the discs, the cladding being composed of a plurality of rings which follow one another along the shaft, with successive rings being directly adjacent to each other and having opposite sets of recesses where in each case opposite recesses on adjacent rings together form an opening of a group of openings which are distributed over a circumference of the cladding and through which the holders belonging to one of the discs project, such that neighboring openings of a group are in each case separated by a web of the cladding which is divided by a boundary line between adjacent rings.

2. The workpiece carrier of claim 1, wherein at least one boundary line is formed in such a way that a mutual rotational position of the adjacent rings inevitably corresponds to a fixed required position.

3. The workpiece carrier of claim 2, wherein the at least one boundary line is at least partly V-shaped.

4. The workpiece carrier of claim 1, wherein the openings of a group between adjacent rings are of the same size in each case, are located at the same height and are distributed uniformly over the circumference of the cladding so that adjacent openings are offset relative to one another in each case by a fixed angular pitch.

5. The workpiece carrier of claim 4, wherein each group has the same number of openings.

6. The workpiece carrier of claim 5, wherein the openings of groups directly following one another along the shaft are offset in each case relative to one another by half the angular pitch.

7. The workpiece carrier of claim 5, wherein the rings are formed in each case so as to be invariant with rotation through the angular pitch.

8. The workpiece carrier of claim 1, wherein the rings are identical, apart from rings at end positions of the workpiece carrier.

9. The workpiece carrier of claim 1, wherein the cladding has a cylindrical shape.

10. The workpiece carrier of claim 1, wherein each disc is supported on a ring.

11. The workpiece carrier of claim 1, wherein the discs each surround the shaft in an annular manner.

12. The workpiece carrier of claim 1, wherein the rings each have, on an inside, a stop on which in each case one of the discs is supported.

13. The workpiece carrier of claim 12, wherein the stop is a round support ring.

14. The workpiece carrier of claim 1, wherein the holders are each rotatably mounted on the discs and a transmission part which acts on rotary stops on the holders and which in each case non-rotatably engages the shaft is provided for each disc.

15. The workpiece carrier of claim 14, wherein the transmission part is in each case axially displaceable on the shaft and axially nondisplaceable relative to the disc.

16. The workpiece carrier of claim 4, wherein the rings are formed in each case so as to be invariant with rotation through the angular pitch.

* * * * *